(12) United States Patent
Cheng et al.

(10) Patent No.: US 9,356,046 B2
(45) Date of Patent: May 31, 2016

(54) STRUCTURE AND METHOD FOR FORMING CMOS WITH NFET AND PFET HAVING DIFFERENT CHANNEL MATERIALS

(71) Applicant: GLOBALFOUNDRIES Inc., Grand Cayman (KY)

(72) Inventors: Kangguo Cheng, Schenectady, NY (US); Bruce B. Doris, Brewster, NY (US); Steven J. Holmes, Albany, NY (US); Ali Khakifirooz, Mountain View, CA (US)

(73) Assignee: GlobalFoundries Inc. (KY)

( * ) Notice: Subject to any disclaimer, the term of this patent is extended or adjusted under 35 U.S.C. 154(b) by 60 days.

(21) Appl. No.: 14/088,025

(22) Filed: Nov. 22, 2013

(65) Prior Publication Data

US 2015/0145048 A1    May 28, 2015

(51) Int. Cl.
*H01L 27/12*    (2006.01)
*H01L 21/8238*  (2006.01)
*H01L 21/84*    (2006.01)
*H01L 27/092*   (2006.01)

(52) U.S. Cl.
CPC .... *H01L 27/1211* (2013.01); *H01L 21/823821* (2013.01); *H01L 21/845* (2013.01); *H01L 27/0924* (2013.01)

(58) Field of Classification Search
None
See application file for complete search history.

(56) References Cited

U.S. PATENT DOCUMENTS

| | | | |
|---|---|---|---|
| 8,294,222 B2 | 10/2012 | Anderson et al. | |
| 8,476,137 B1 * | 7/2013 | LiCausi et al. | 438/270 |
| 8,481,410 B1 | 7/2013 | LiCausi et al. | |
| 2006/0110892 A1 * | 5/2006 | Orlowski et al. | 438/435 |
| 2007/0120154 A1 * | 5/2007 | Zhu et al. | 257/288 |
| 2008/0111184 A1 * | 5/2008 | Beintner | H01L 29/7851 257/327 |
| 2011/0084340 A1 * | 4/2011 | Yuan | H01L 21/76224 257/368 |
| 2012/0068267 A1 * | 3/2012 | Bedell et al. | 257/350 |
| 2012/0098067 A1 | 4/2012 | Yin et al. | |
| 2012/0187453 A1 | 7/2012 | Shepard, Jr. et al. | |
| 2012/0313169 A1 * | 12/2012 | Wahl | H01L 21/823431 257/347 |
| 2013/0153964 A1 | 6/2013 | Guo et al. | |
| 2014/0357060 A1 * | 12/2014 | Liu et al. | 438/479 |

* cited by examiner

*Primary Examiner* — Charles Garber
*Assistant Examiner* — Alia Sabur
(74) *Attorney, Agent, or Firm* — Heslin Rothenberg Farley & Mesiti P.C.; George Blasiak (57) ABSTRACT

Embodiments of the present invention provide an improved structure and method for forming CMOS field effect transistors. In embodiments, silicon germanium (SiGe) is formed on a PFET side of a semiconductor structure, while silicon is disposed on an NFET side of a semiconductor structure. A narrow isolation region is formed between the PFET and NFET. The NFET fins are comprised of silicon and the PFET fins are comprised of silicon germanium.

10 Claims, 12 Drawing Sheets

STRUCTURE AND METHOD FOR FORMING CMOS WITH NFET AND PFET HAVING DIFFERENT CHANNEL MATERIALS

FIELD OF THE INVENTION

The present invention relates generally to semiconductor fabrication, and more particularly, to formation of CMOS field effect transistor structures.

BACKGROUND OF THE INVENTION

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of fin-type field effect transistor (FinFET) devices. The FinFET device, for example, may be a complementary metal-oxide-semiconductor (CMOS) device comprising a P-type metal-oxide-semiconductor (PMOS) FinFET device and a N-type metal-oxide-semiconductor (NMOS) FinFET device. CMOS technology is used in a wide variety of circuit designs. It is therefore desirable to have improvements in the fabrication of CMOS finFET semiconductor structures.

SUMMARY OF THE INVENTION

In a first aspect, embodiments of the present invention provide a method of forming a semiconductor structure, comprising: forming a first semiconductor layer; forming a second semiconductor layer; forming a gap in the semiconductor structure to form an NFET side of the semiconductor structure, and a PFET side of the semiconductor structure, wherein the NFET side is separated from the PFET side by the gap; removing the second semiconductor layer from the NFET side of the semiconductor structure; and forming a plurality of fins in the first semiconductor layer on the NFET side and forming a plurality of fins in the second semiconductor layer on the PFET side.

In a second aspect, embodiments of the present invention provide a method of forming a semiconductor structure, comprising: forming a recess on a PFET side of a silicon-on-insulator (SOI) layer disposed on a buried oxide (BOX) layer, wherein the BOX layer is disposed on a semiconductor substrate, and wherein the recess extends partially into the SOI layer, thereby forming a recessed portion of the SOI layer on the PFET side of the SOI layer, and a non-recessed portion on an NFET side of the SOI layer; forming a gap in the semiconductor structure, wherein the NFET side is separated from the PFET side by the gap; growing an epitaxial silicon germanium (SiGe) layer on the recessed portion of the SOI layer; converting the SOI layer on the PFET side to SiGe; and forming a plurality of fins in the SOI layer on the NFET side and forming a plurality of fins in the SiGe layer on the PFET side.

In a third aspect, embodiments of the present invention provide a semiconductor structure, comprising: a semiconductor substrate comprising a first semiconductor material and a second semiconductor material; a first set of fins comprised of the first semiconductor material, disposed on a first side of the semiconductor structure; a second set of fins comprised of the second semiconductor material, disposed on a second side of the semiconductor structure; an insulator region disposed between the first side of the semiconductor structure and the second side of the semiconductor structure, wherein the insulator region has a width ranging from about 10 nanometers to about 50 nanometers.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAILED DESCRIPTION

Embodiments of the present invention provide an improved structure and method for forming CMOS field effect transistors. In embodiments, silicon germanium (SiGe) is formed on a PFET side of a semiconductor structure, while silicon is disposed on an NFET side of a semiconductor structure. A narrow isolation region is formed between the PFET and NFET. In embodiments, the NFET fins are comprised of silicon and the PFET fins are comprised of silicon germanium.

Within this disclosure, when an element as a layer, region, substrate, or wafer is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
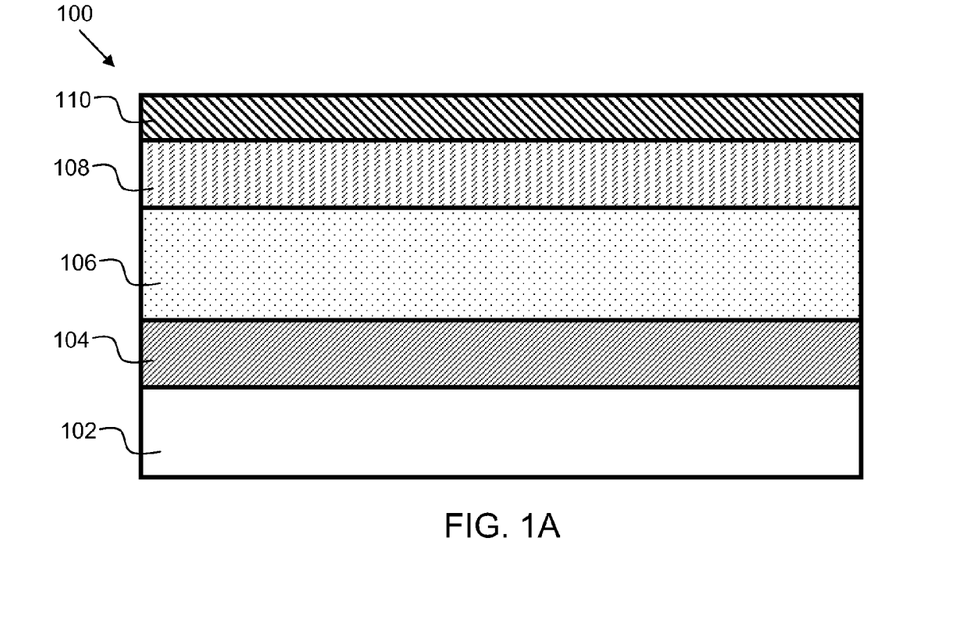
FIG. 1A is a semiconductor structure at a starting point for embodiments of the present invention.

FIG. 1A is a semiconductor structure 100 at a starting point for embodiments of the present invention. A bulk substrate 102 forms the base of semiconductor structure 100. Bulk substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. An insulator layer 104 is disposed on the bulk substrate 102. In embodiments, insulator layer 104 may be comprised of oxide, such as silicon oxide, and may be referred to as a buried oxide (BOX) layer. A first semiconductor layer 106 is disposed on the insulator layer 104. In embodiments, first semiconductor layer 106 is comprised of silicon, forming a so-called silicon-on-insulator (SOI) structure. Within this disclosure, layer 106 may be referred to as a silicon-on-insulator (SOI) layer. A second semiconductor layer 108 is disposed on the first semiconductor layer 106. In embodiments, second semiconductor layer 108 is comprised silicon germanium (SiGe). Within this disclosure, layer 108 may be referred to as a SiGe layer. In some embodiments, the concentration of germanium in layer 108 may range from about 30 atomic percent to about 50 atomic percent, although germanium concentration less than 30% or greater than 50% may also be possible. Disposed on SiGe layer 108 is a hardmask layer 110. In some embodiments, hardmask layer 110 may comprise a nitride, such as silicon nitride. In some embodiments, the second semiconductor layer 108 is comprised of germanium. In some embodiments, the second semiconductor layer 108 may be comprised of a different semiconductor material, so long as it differs from the material of first semiconductor layer 106.

Figure 1B:
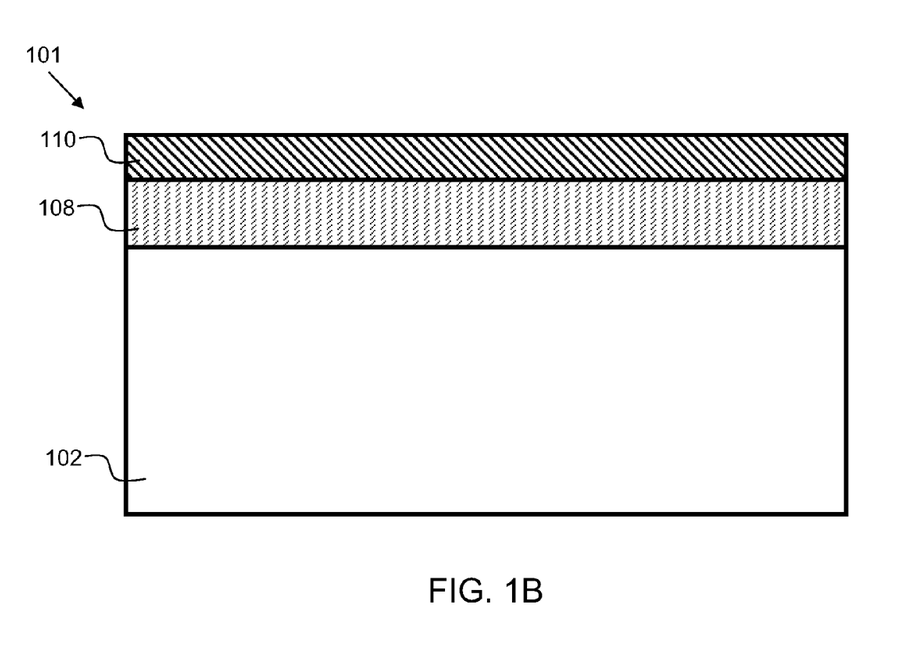
FIG. 1B is a semiconductor structure at a starting point for alternative embodiments of the present invention.

FIG. 1B is a semiconductor structure 101 at a starting point for embodiments of the present invention. In this embodiment, a "bulk" structure is used, where bulk substrate 102 forms the first semiconductor layer, and second semiconductor layer 108 is disposed on the bulk substrate.

Figure 2:
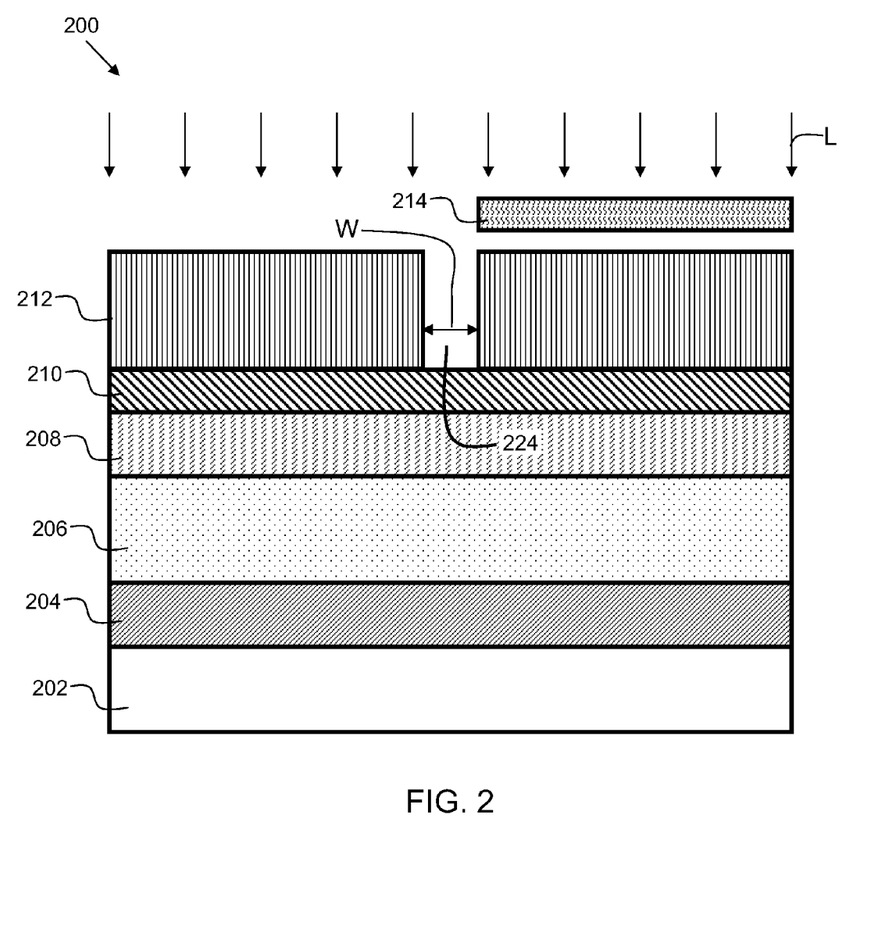
FIG. 2 is a semiconductor structure after subsequent process steps of depositing and patterning a resist layer.

FIG. 2 is a semiconductor structure 200 after subsequent process steps of depositing and patterning a resist layer 212. As stated previously, similar elements may be referred to by similar numbers in various figures (FIGs) of the drawing, in which case typically the last two significant digits may be the same. For example, bulk substrate 202 of FIG. 2 is similar to bulk substrate 102 of FIG. 1. The resist layer 212 is patterned utilizing a lithographic mask 214, such that gap 224 is formed in the resist. The gap 224 has a width W. In embodiments, the width W ranges from about 10 nanometers to about 50 nanometers. When light L (indicated by downward arrows) is incident on the resist 212, it causes development of the area adjacent to the mask 214. In embodiments, resist layer 212 comprises a hybrid resist, which has a property of forming a narrow development range adjacent to the edge of a mask. The hybrid resist comprises a combination of positive and negative photoresists and is described in detail in U.S. Pat. No. 6,114,082, filed Sep. 19, 1996, which is hereby incorporated by reference herein in its entirety.

Figure 3:
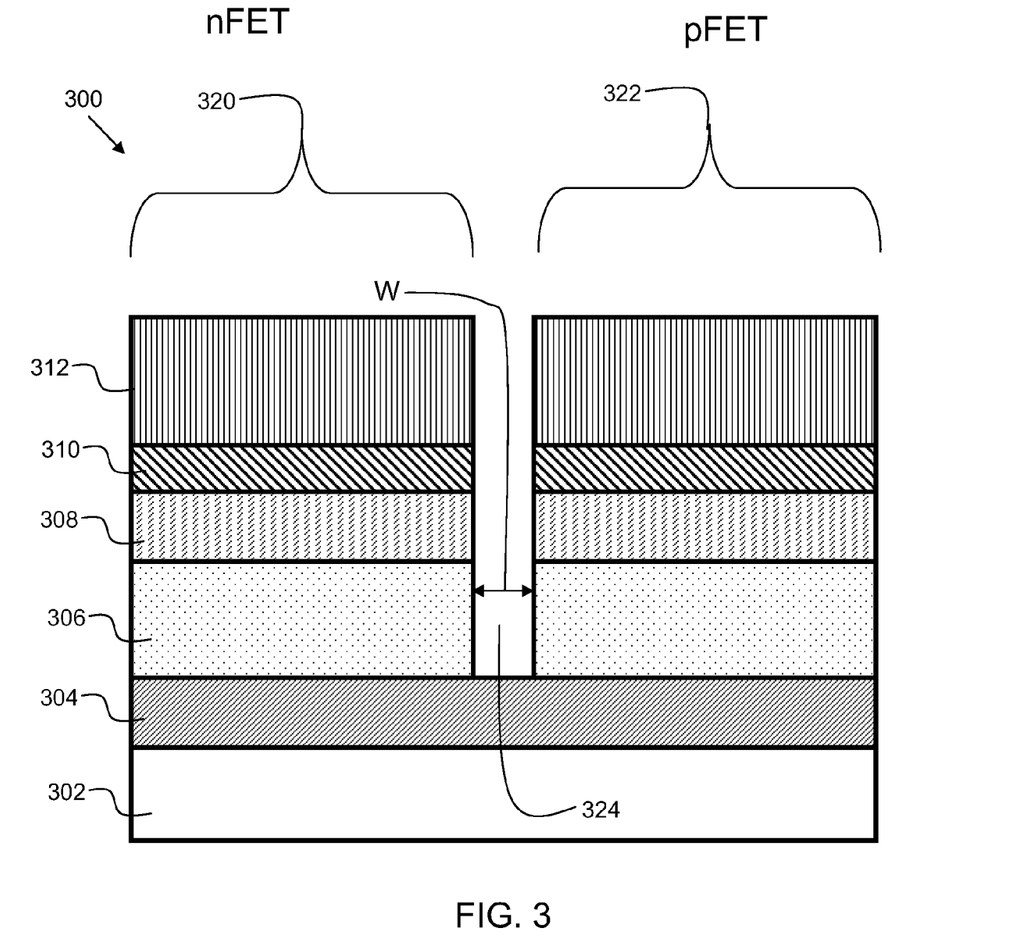
FIG. 3 is a semiconductor structure after a subsequent process step of forming a gap in the semiconductor structure.

FIG. 3 is a semiconductor structure 300 after a subsequent process step of forming a gap 324 in the semiconductor structure. In embodiments, the gap 324 is formed by an anisotropic etch process, such as a reactive ion etch (RIE). This forms a cavity in the semiconductor structure disposed underneath the gap in the hybrid resist layer, thereby forming gap 324, wherein the cavity (gap) extends to the BOX layer 304. The gap 324 has a width W. In embodiments, the width W ranges from about 10 nanometers to about 50 nanometers. The etch process stops on the insulator layer 304. The gap 324 thus separates the structure 300 into two sides: NFET side 320 and PFET side 322. Once the fabrication process is complete, an NFET (N-type field effect transistor) is formed on NFET side 320, having a first channel material, and a PFET (P-type field effect transistor) is formed on PFET side 322, having a second channel material.

Figure 4A:
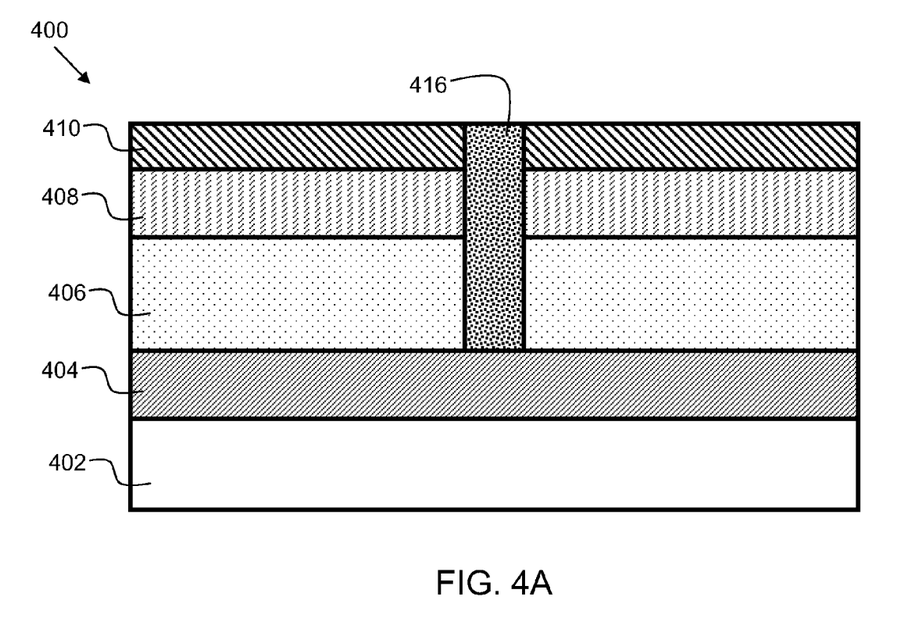
FIG. 4A is a semiconductor structure after subsequent process steps of removing the resist layer, and filling the gap with an insulator material.

FIG. 4A is a semiconductor structure 400 after subsequent process steps of removing the resist layer (compare with 312 of FIG. 3), and filling the gap with an insulator material 416. In embodiments, insulator material 416 may be comprised of an oxide, such as silicon oxide, and may include a flowable oxide, or LPCVD (low pressure chemical vapor deposition) oxide.

Figure 4B:
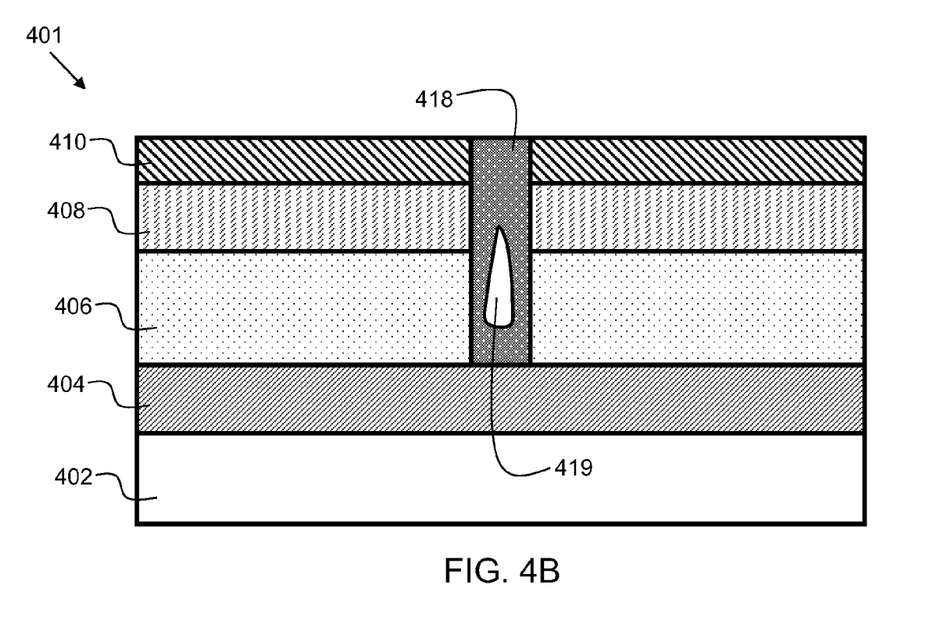
FIG. 4B is a semiconductor structure after subsequent process steps of removing the resist layer, and filling the gap with an insulator material in accordance with an alternative embodiment.

FIG. 4B is a semiconductor structure 401 similar to 400 of FIG. 4A, except that the gap is filled with a conformal nitride 418, such as a silicon nitride, which is deposited in the gap, and then pinched off at the top. In some cases, a void 419 may be present in the conformal nitride 418.

Figure 5:
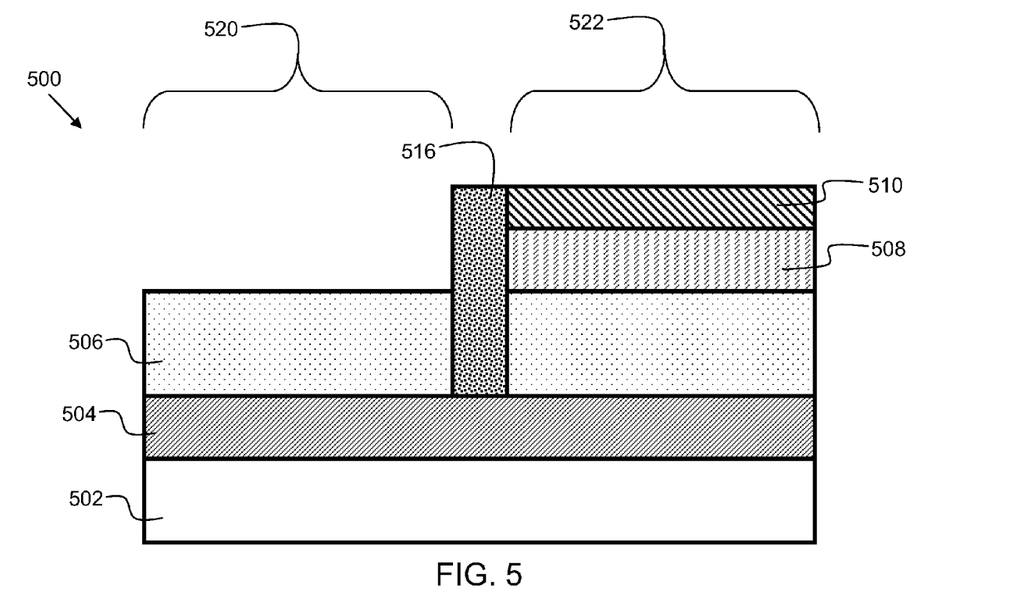
FIG. 5 is a semiconductor structure after subsequent process steps of removing the nitride layer and SiGe layer from the NFET side of the semiconductor structure.

FIG. 5 is a semiconductor structure 500 after subsequent process steps (following from FIG. 4A) of removing the nitride layer and SiGe layer from the NFET side 520 of the semiconductor structure 500. The removal may be accomplished via industry-standard lithographic and etching techniques.

Figure 6:
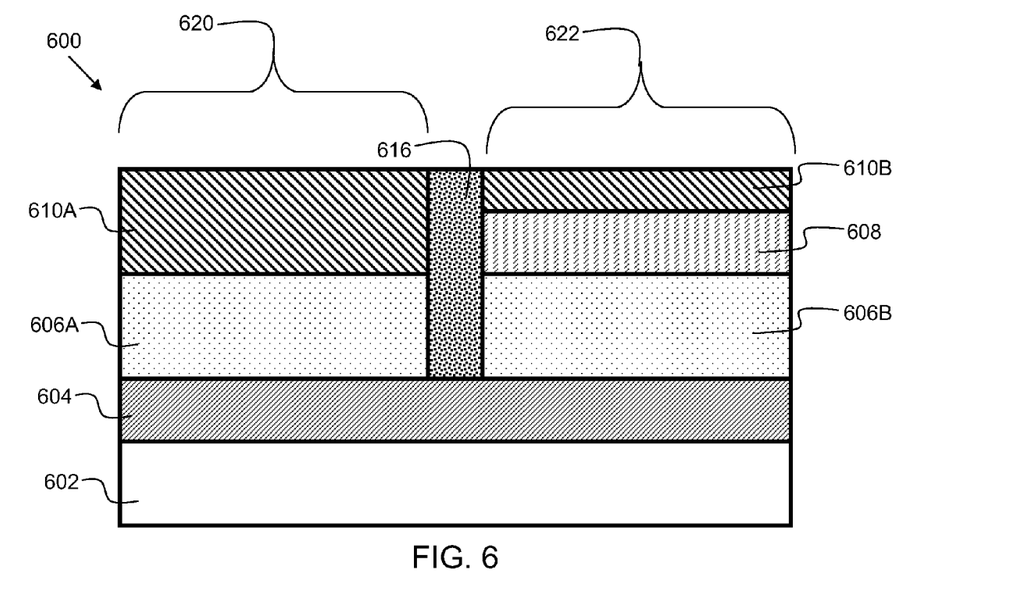
FIG. 6 is a semiconductor structure after subsequent process steps of replenishing the nitride layer on the NFET side of the semiconductor structure and planarizing the semiconductor structure.

FIG. 6 is a semiconductor structure 600 after subsequent process steps of replenishing the nitride layer 610A on the NFET side 620 of the semiconductor structure and planarizing the semiconductor structure 600. The semiconductor structure 600 may be planarized after deposition of nitride layer 610A. In embodiments, the planarization may be performed with a chemical mechanical polish (CMP) process.

Figure 7:
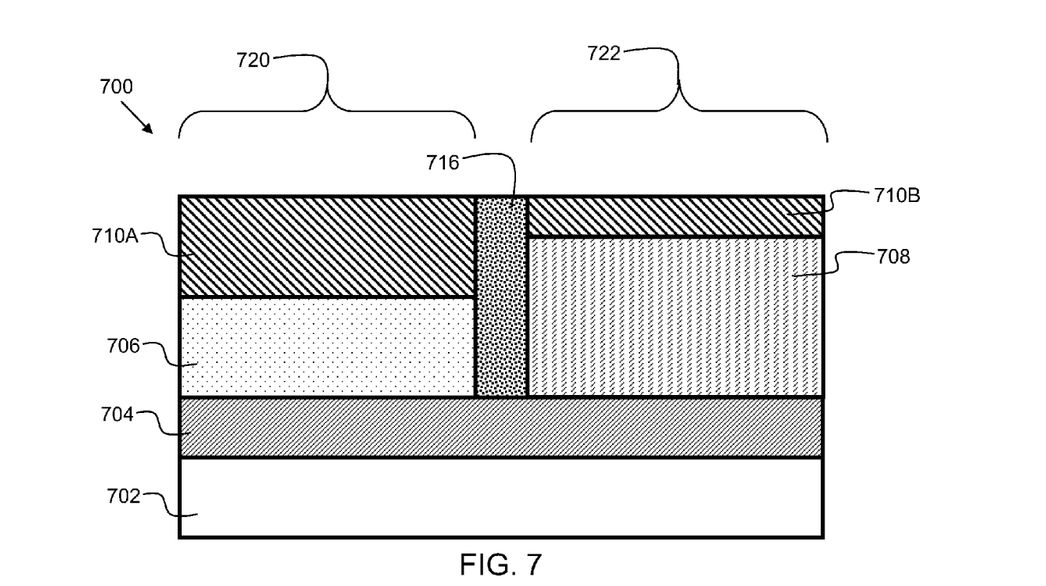
FIG. 7 is a semiconductor structure after a subsequent process step of converting the SOI layer on the PFET side into SiGe.

FIG. 7 is a semiconductor structure 700 after a subsequent process step of converting the SOI layer on the PFET side (606B of FIG. 6) into SiGe, creating larger SiGe region 708 (as compared with 608 of FIG. 6) on the PFET side 722. In embodiments, the conversion process includes thermal mixing, where the semiconductor structure 700 is annealed to disperse SiGe from the layer (608 of FIG. 6) into the SOI layer on the PFET side (606B of FIG. 6). In embodiments, the anneal may be performed at a process temperature ranging from about 1000 degrees Celsius to about 1100 degrees Celsius for a duration ranging from about 1 minute to about 70 minutes. In the embodiments that start with a bulk semiconductor structure (see 101 of FIG. 1B), the anneal (conversion) step can be omitted.

Figure 8:
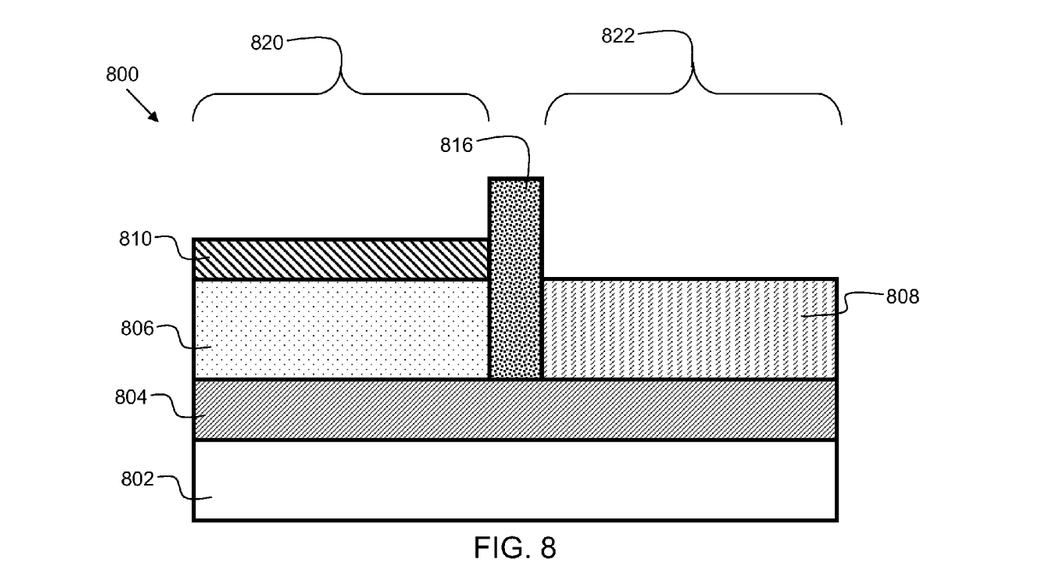
FIG. 8 is a semiconductor structure after a subsequent process step of recessing the SiGe region on the PFET side.

FIG. 8 is a semiconductor structure 800 after a subsequent process step of recessing the SiGe region on the PFET side. First, a nitride etch back is performed to expose the SiGe region 808 on the PFET side 822. Nitride region 810 remains on NFET side 820 since the starting thickness on that side is greater than on the PFET side 822 (compare the thickness of nitride region 710A and 710B in FIG. 7). Using a timed etch, the thickness of the SiGe region 808 may be made to be the same as the thickness of SOI layer 806.

Figure 9:
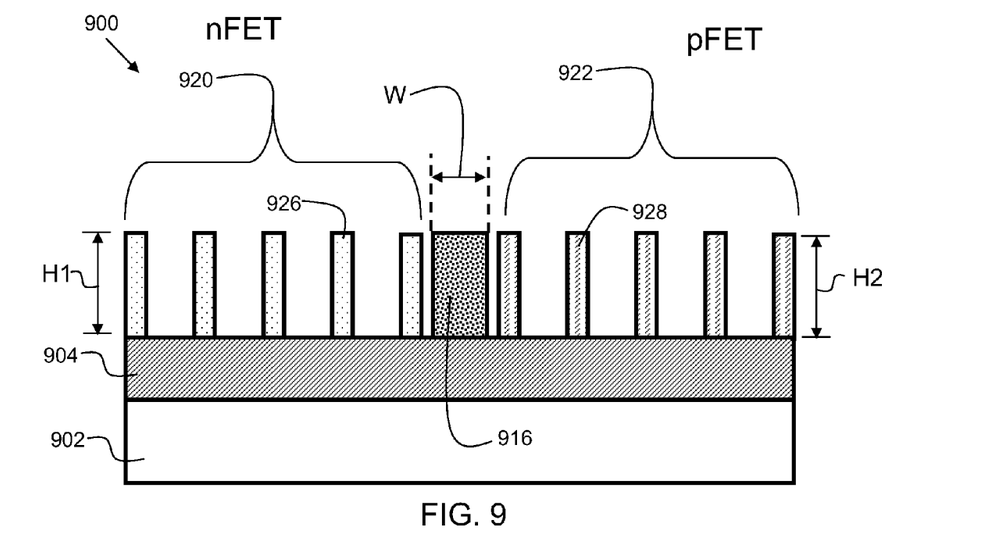
FIG. 9 is a semiconductor structure in accordance with embodiments of the present invention, after a subsequent process step of fin formation.

FIG. 9 is a semiconductor structure 900 in accordance with embodiments of the present invention, after a subsequent process step of fin formation. The remaining nitride region (810 of FIG. 8) is removed, and the insulator region 916 may be recessed to a desired level. The insulator region 916 has width W. In some embodiments, the width W ranges from about 10 nanometers to about 50 nanometers. A first set of fins are formed on NFET side 920. The NFET fins are indicated generally as 926. A second set of fins are formed on PFET side 922. The PFET fins are indicated generally as 928. The fins may be formed by any suitable technique, such as a sidewall image transfer (SIT) process. The fins 926 on NFET side 920 are comprised of silicon, while the fins 928 on PFET side 922 are formed of silicon germanium (SiGe). The channels of each transistor are contained within the fins. Silicon has better carrier mobility for NFET transistors, and SiGe has better carrier mobility for PFET transistors. Hence, the embodiment of FIG. 9 provides improved performance for each transistor of the CMOS pair, while also enabling closer placement of the finFETs with dissimilar channel materials, which increases circuit density and reduces lengths of metallization wiring, thereby improving overall performance of an integrated circuit utilizing CMOS technology.

Figure 10:
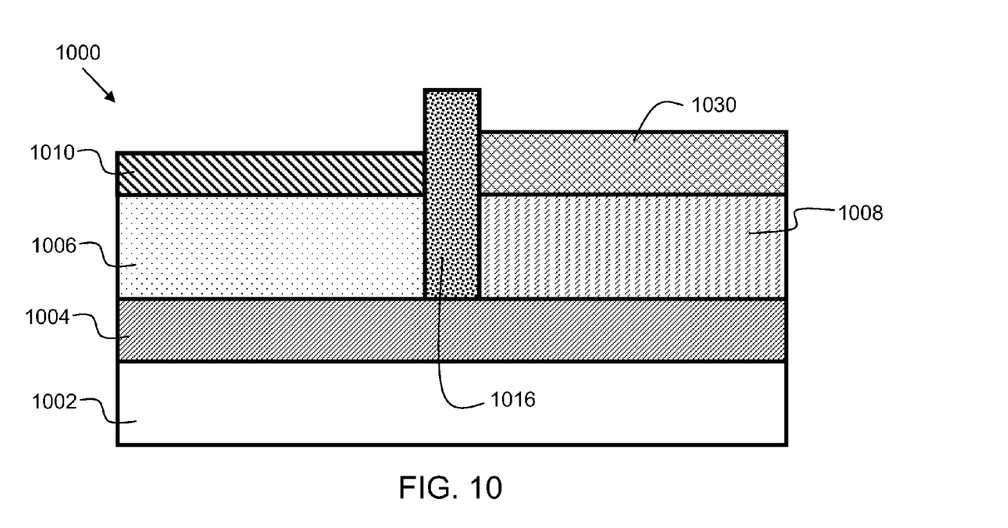
FIG. 10 is a semiconductor structure after a subsequent process step of converting the SOI layer on the PFET side into SiGe, in accordance with alternative embodiments.

FIG. 10 is a semiconductor structure 1000 after a subsequent process step of converting the SOI layer on the PFET side into SiGe, in accordance with alternative embodiments. Semiconductor structure 1000 follows from semiconductor structure 600 of FIG. 6. In this case, the nitride is stripped, exposing the SiGe layer 608. A thermal oxidation process is then performed, forming oxide region 1030. The thermal oxidation process takes place at an elevated temperature, such that germanium from the SiGe layer 608 diffuses into the SOI layer 606B. The result, shown in FIG. 10, is that layer 1008 is comprised of SiGe. However, the thermal oxidation process actually consumes some of layer 1008, effectively "lowering" layer 1008. By controlling the thermal oxidation process, a desired thickness of layer 1008 is achieved. In some embodiments, the thickness of layer 1008 may be similar to the thickness of layer 1006. In other embodiments, the thickness of layer 1008 may be different than the thickness of layer 1006. The thickness of layers 1006 and 1008 determine the fin height for the NFET and PFET respectively.

Figure 11:
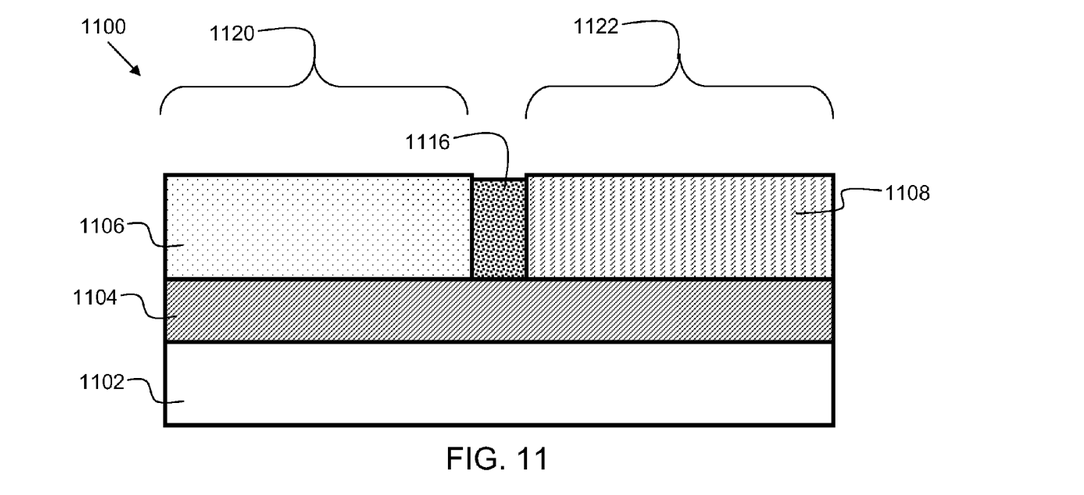
FIG. 11 is a semiconductor structure after subsequent process steps of removing the nitride and thermal oxide.

FIG. 11 is a semiconductor structure 1100 after subsequent process steps of removing the nitride and thermal oxide. Semiconductor structure 1100 comprises SOI layer 1106 on the NFET side 1120, and SiGe layer 1108 on the PFET side 1122. From this point forward, the fins are formed, resulting in a structure similar to structure 900 of FIG. 9.

Figure 12:
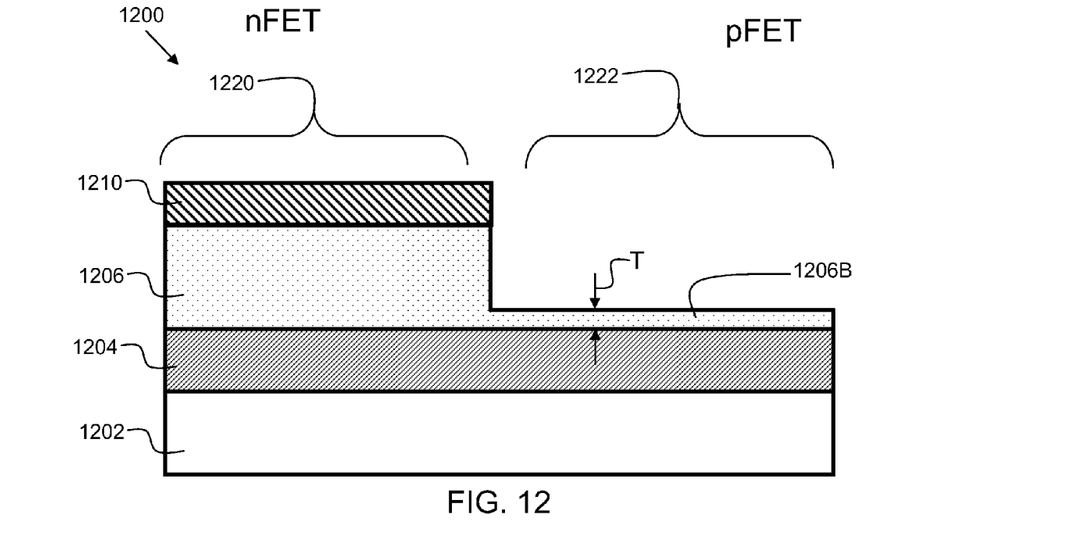
FIG. 12 is a semiconductor structure at a starting point for alternative embodiments of the present invention.

FIG. 12 is a semiconductor structure 1200 at a starting point for alternative embodiments of the present invention. Semiconductor structure 1200 is a silicon-on-insulator structure comprising bulk semiconductor substrate 1202. An insulator layer 1204 is disposed on the bulk semiconductor substrate 1202. A silicon layer 1206 is disposed on the insulator layer 1204. Silicon layer 1206 may be referred to as a SOI layer. A nitride layer 1210 is disposed on the SOI layer 1206. A recess is formed on the PFET side 1222 of the structure 1200, while the nitride layer 1210 is preserved on the NFET side 1220 of the structure. The recessing of the PFET side 1222 of structure 1200 may be performed using industry-standard patterning and etching techniques. The recess on the PFET side 1222 extends partially into the SOI layer, and as a result of the recess, a recessed portion of the SOI layer, indicated as 1206B, remains on the PFET side 1222, while a non-recessed portion of SOI layer 1206 remains on the NFET side 1220. In these embodiments, no SiGe layer is deposited initially on the entire structure (as compared with layer 108 in FIG. 1). In some embodiments, the recessed portion of SOI layer 1206B has a thickness T ranging from about 5 nanometers to about 15 nanometers.

Figure 13:
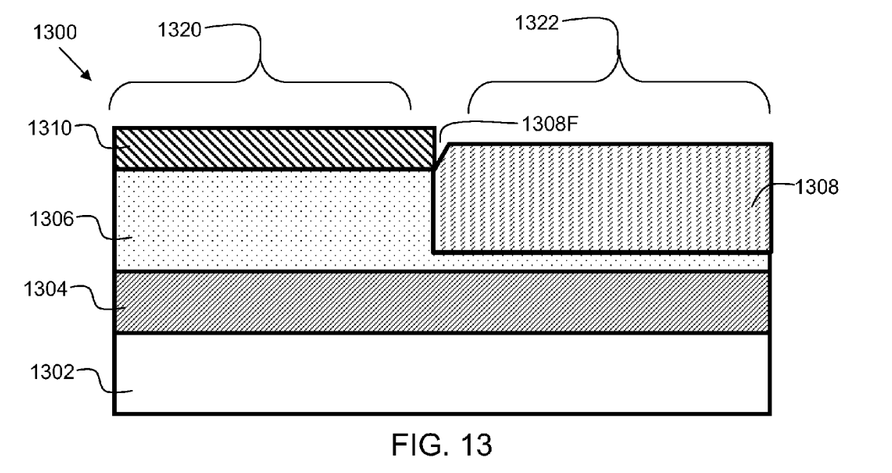
FIG. 13 is a semiconductor structure after a subsequent process step of epitaxial SiGe growth on the PFET side of the semiconductor structure.

FIG. 13 is a semiconductor structure 1300 after a subsequent process step of epitaxial SiGe growth on the PFET side 1322 of the semiconductor structure, resulting in the formation of SiGe layer 1308. The NFET side 1320 does not have any SiGe layer, since the nitride layer 1310 prevents exposure of the SOI layer 1306 on the NFET side 1320. The SiGe layer 1308 may grow faceted once it exceeds the level of SOI layer 1306. The faceted portion 1308F is removed during a subsequent recess of the SiGe layer 1308.

Figure 14:
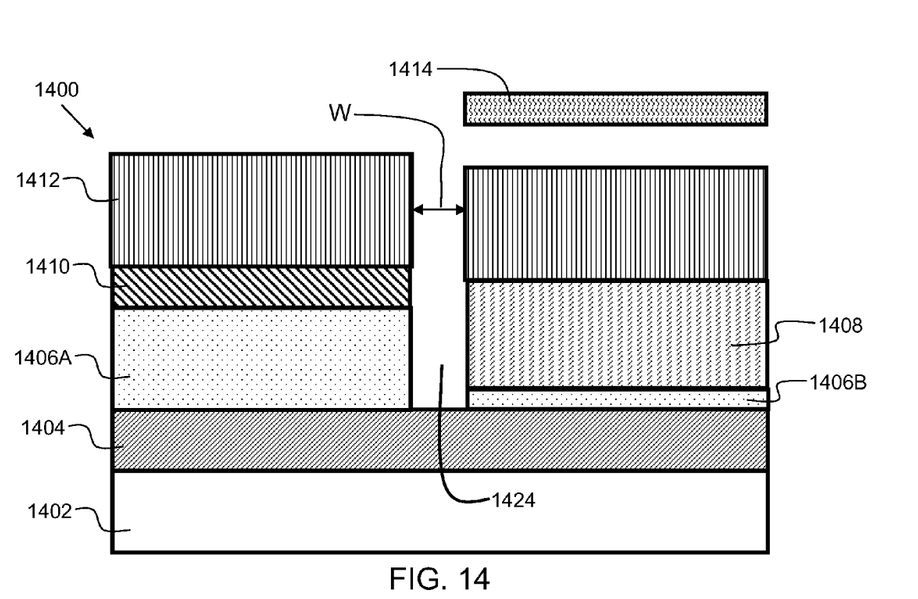
FIG. 14 is a semiconductor structure after subsequent process steps of depositing and patterning a resist layer, and forming a gap in the semiconductor structure.

FIG. 14 is a semiconductor structure 1400 after subsequent process steps of depositing and patterning a resist layer 1412, and forming a gap 1424 in the semiconductor structure. Prior to depositing resist layer 1412, the SiGe layer 1408 may be recessed, removing the faceted portion (see 1308F of FIG. 13). The amount of recess determines the height of the fins for the PFET transistor. In some embodiments, the recess is such that the level of the top of SiGe layer 1408 is approximately at the same level as the top of SOI region 1406A. In other embodiments, the recess is such that the top of SiGe layer 1408 is not at the same level as the top of SOI region 1406A, but may instead be greater than, or less than the level of the top of SOI region 1406A. In some cases, it may be desirable to have a different fin height for the PFET than the NFET. This allows device characteristics to be fine tuned.

Similar to the process previously described, resist layer 1412 may be a hybrid resist, capable of forming very narrow gaps when lithographically processed using mask 1414. Gap 1424 has width W. In embodiments, the width W ranges from about 10 nanometers to about 50 nanometers. In embodiments, the gap 1424 may be formed with an anisotropic etch process, such as a reactive ion etch (RIE) process. The gap 1424 terminates at the insulator layer 1404.

Figure 15:
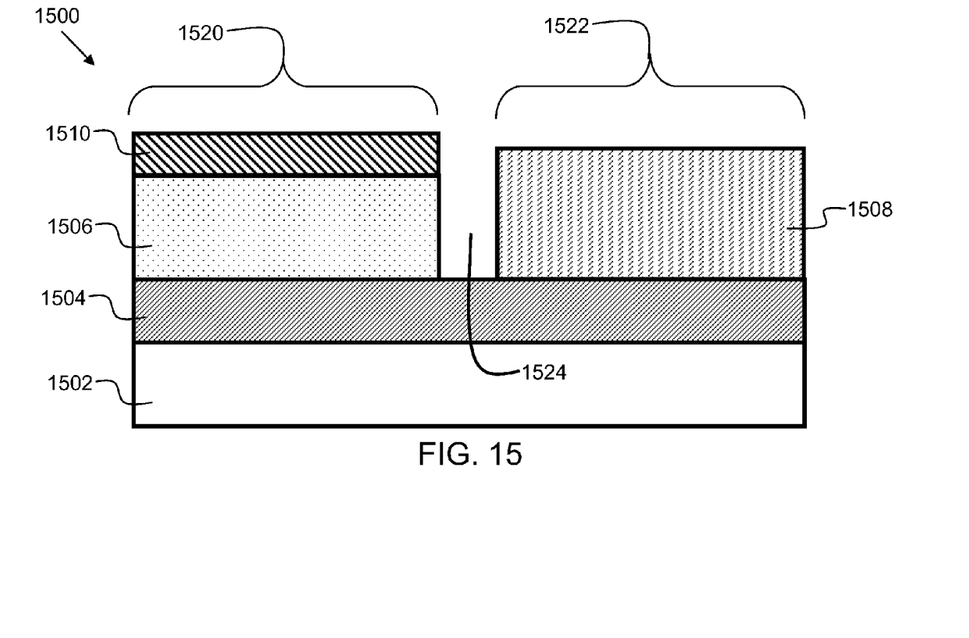
FIG. 15 is a semiconductor structure after a subsequent process step of converting the SOI layer on the PFET side into SiGe.

FIG. 15 is a semiconductor structure 1500 after a subsequent process step of converting the SOI layer on the PFET side (see 1206B of FIG. 12) into SiGe, thereby forming SiGe layer 1508 on the PFET side 1522. In embodiments, the conversion of the SOI layer may be performed with an anneal process. In embodiments, the anneal is performed at a process temperature ranging from about 1000 degrees Celsius to about 1100 degrees Celsius for a duration ranging from about 30 seconds to about 20 minutes. The duration may be less than the duration used in the embodiment of FIG. 7, because the portion of SOI layer that gets converted is fairly thin (in some cases, ranging from about 5 nanometers to about 15 nanometers).

Figure 16:
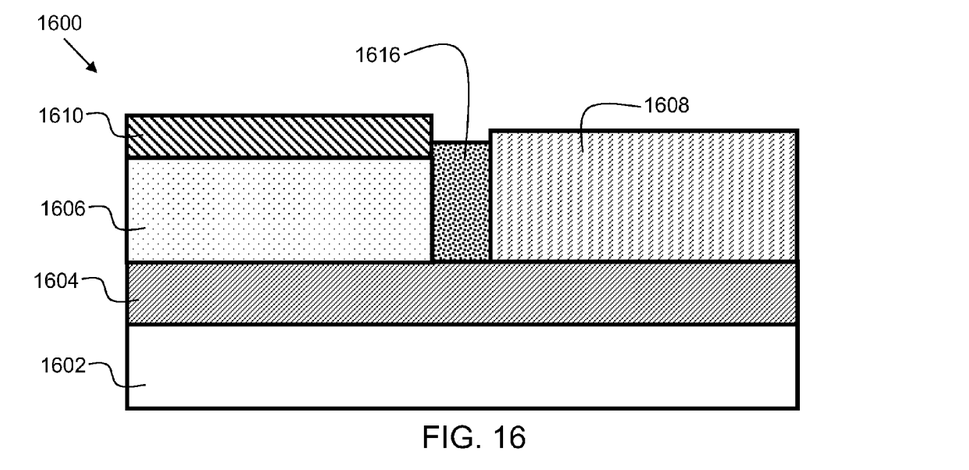
FIG. 16 is a semiconductor structure after a subsequent process step of depositing an insulator material into the gap.

FIG. 16 is a semiconductor structure 1600 after a subsequent process step of depositing an insulator material 1616 into the gap. In alternative embodiments, a conformal nitride layer, such as a silicon nitride layer, may be deposited in the gap, similar to as shown in FIG. 4B.

Figure 17:
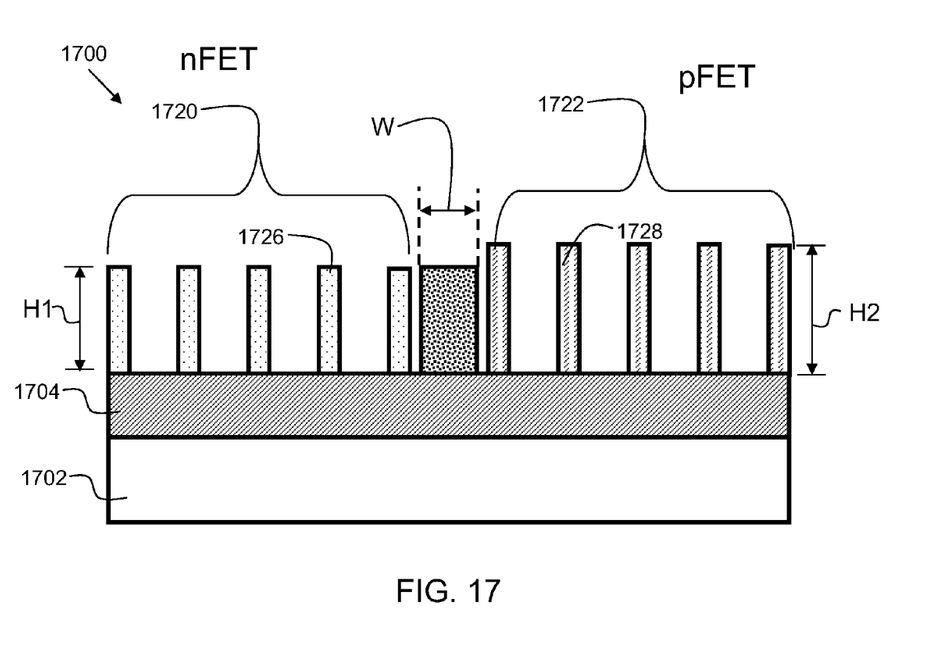
FIG. 17 is a semiconductor structure in accordance with alternative embodiments of the present invention, after a subsequent process step of fin formation.

FIG. 17 is a semiconductor structure in accordance with alternative embodiments of the present invention, after a subsequent process step of fin formation. Structure 1700 is similar to structure 900 of FIG. 9, except that the height H1 of the fins 1726 on the NFET side 1720 is not equal to the height H2 of the fins 1728 of the PFET side 1722. In some embodiments, H1 ranges from about 70 nanometers to about 150 nanometers, and H2 ranges from about 10 nanometers to about 20 nanometers greater than the H1 value. In embodiments, the width W of isolation between the NFET and PFET may range from about 10 nanometers to about 50 nanometers. Hence, structure 1700 comprises a CMOS pair of an NFET and a PFET, where the fins of the NFET are comprised of a first material, and the fins of the PFET are comprised of a second material, and the devices have a narrow isolation region between them. By using two different materials for the fins (and thus, the channel for each transistor), device performance can be optimized by using a material that enhances carrier mobility for electrons in the NFET, and using a different material that enhances carrier mobility for holes in the PFET. Note that while in the structure 1700 of FIG. 17, the PFET fins 1728 are taller than the NFET fins 1726, in other embodiments, the NFET fins 1726 may be taller than the PFET fins 1728.

Figure 18:
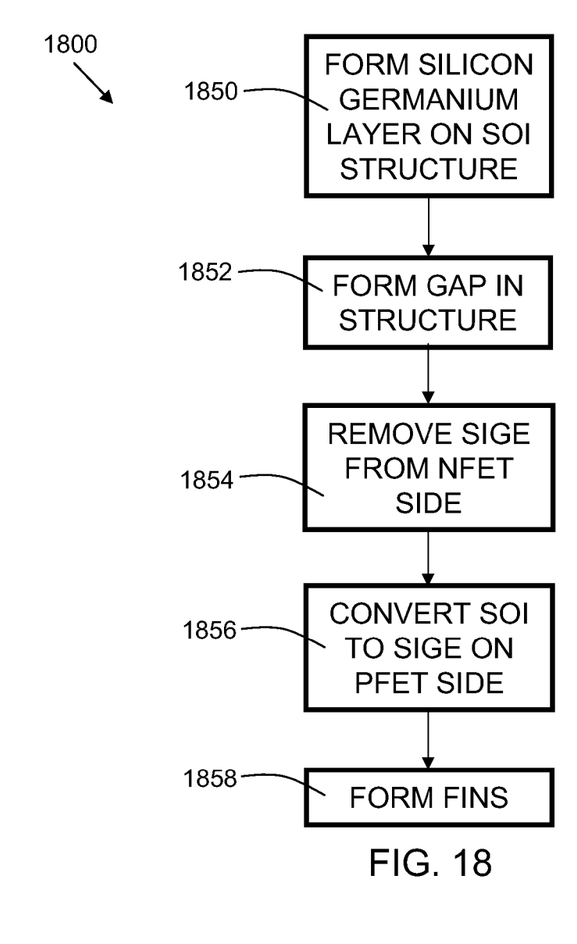
FIG. 18 is a flowchart indicating process steps for embodiments of the present invention.

FIG. 18 is a flowchart 1800 indicating process steps for embodiments of the present invention. In process step 1850, a silicon germanium (SiGe) layer is formed on a silicon-on-insulator (SOI) structure (see 108 of FIG. 1). In process step 1852, a gap is formed in the semiconductor structure (see 324 of FIG. 3). In process step 1854, SiGe is removed from the NFET side of the structure (see 500 of FIG. 5). In process step 1856, the silicon-on-insulator portion on the PFET side is converted to SiGe (see 708 of FIG. 7). In process step 1858, fins are formed for an NFET and a PFET (see 900 of FIG. 9).

Figure 19:
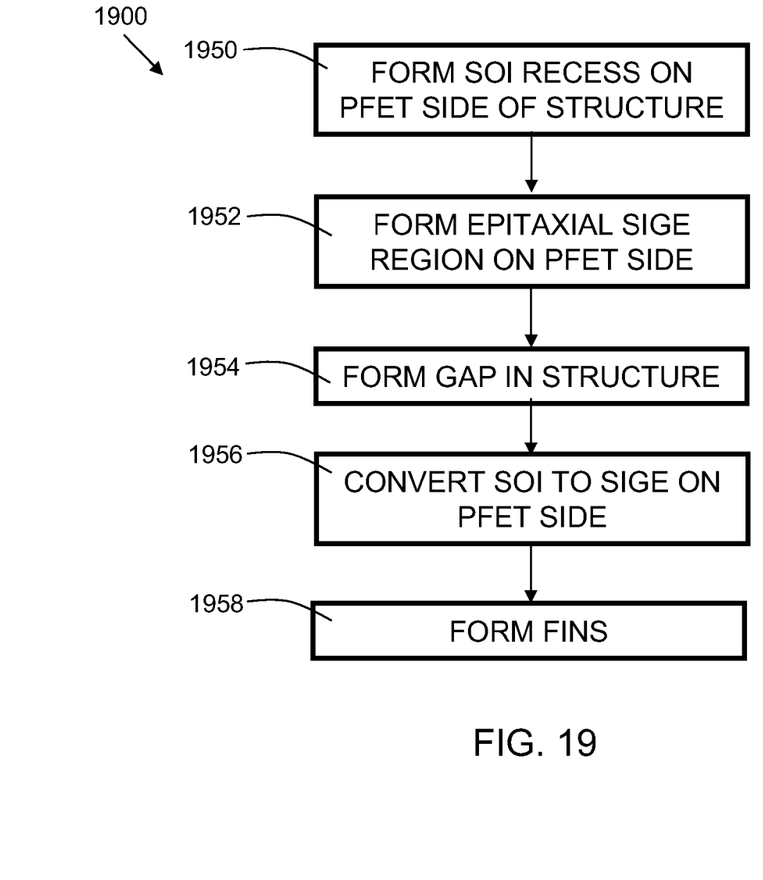
FIG. 19 is a flowchart indicating process steps for alternative embodiments of the present invention.

FIG. 19 is a flowchart 1900 indicating process steps for alternative embodiments of the present invention. In process step 1950, a silicon-on-insulator recess is formed on the PFET side of the structure (see 1200 of FIG. 12). In process step 1952, an epitaxial silicon germanium (SiGe) region is formed on the PFET side of the structure (see 1308 of FIG. 13). In process step 1954, a gap is formed in the semiconductor structure (see 1424 of FIG. 14). In process step 1956, the silicon-on-insulator portion on the PFET side is converted to SiGe (see 1508 of FIG. 15). In process step 1958, fins are formed for an NFET and a PFET (see 1700 of FIG. 17).

Although the invention has been shown and described with respect to a certain preferred embodiment or embodiments, certain equivalent alterations and modifications will occur to others skilled in the art upon the reading and understanding of this specification and the annexed drawings. For example, although various details have been described for SOI embodiments, other embodiments may utilize a bulk semiconductor structure, with no intervening BOX layer. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
   forming a recess on a PFET side of a silicon-on-insulator (SOI) layer disposed on a buried oxide (BOX) layer, wherein the BOX layer is disposed on a semiconductor substrate, and wherein the recess extends partially into the SOI layer, thereby forming a recessed portion of the SOI layer on the PFET side of the SOI layer, and a non-recessed portion on an NFET side of the SOI layer;
   forming a gap in the semiconductor structure, wherein the NFET side is separated from the PFET side by the gap, and wherein the gap extends to, and terminates at a top level of the buried oxide layer;
   growing an epitaxial silicon germanium (SiGe) layer on the recessed portion of the SOI layer;
   converting the SOI layer on the PFET side to SiGe; and
   forming a plurality of fins in the SOI layer on the NFET side and forming a plurality of fins in the SiGe layer on the PFET side; and
   further comprising depositing an insulator into the gap, wherein the forming a plurality of fins is performed subsequent to the depositing an insulator in the gap.

2. The method of claim 1, further comprising converting the silicon layer on the PFET side of the semiconductor structure to silicon germanium using an anneal process.

3. The method of claim 1, further comprising converting the silicon layer on the PFET side of the semiconductor structure to silicon germanium using a thermal oxidation process.

4. The method of claim 1, wherein forming a gap in the semiconductor structure comprises:
   depositing a hybrid resist layer on the semiconductor structure;
   patterning the resist to form a gap in the hybrid resist layer;
   performing an etch to form a cavity in the semiconductor structure disposed underneath the gap in the hybrid resist layer, wherein the cavity extends to the BOX layer.

5. The method of claim 4, further comprising recessing the SiGe layer to a level even with the NFET side of the SOI layer.

6. The method of claim 4, further comprising recessing the SiGe layer to a level that is about 10 nanometers to about 20 nanometers above the NFET side of the SOI layer.

7. The method of claim 1, wherein depositing an insulator into the gap comprises depositing a flowable oxide.

8. The method of claim 1, wherein the forming a plurality of fins is performed subsequent to the forming a gap.

9. The method of claim 1, wherein the method is performed so that the insulator remains subsequent to the forming a plurality of fins.

10. The method of claim 1, wherein the forming a gap is performed subsequent to the growing an epitaxial silicon germanium layer.

* * * * *